US007609578B2

(12) United States Patent
Buer et al.

(10) Patent No.: US 7,609,578 B2
(45) Date of Patent: Oct. 27, 2009

(54) QUAD SRAM BASED ONE TIME PROGRAMMABLE MEMORY

(75) Inventors: Myron Buer, Gilbert, AZ (US); Jonathan Schmitt, Eden Prairie, MN (US); Laurentiu Vasiliu, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 166 days.

(21) Appl. No.: 11/933,073

(22) Filed: Oct. 31, 2007

(65) Prior Publication Data

US 2009/0109723 A1 Apr. 30, 2009

(51) Int. Cl.
*G11C 17/18* (2006.01)
(52) U.S. Cl. .............................. 365/225.7; 365/189.05; 365/189.11
(58) Field of Classification Search .............. 365/225.7, 365/189.05, 189.11
See application file for complete search history.

(56) References Cited

U.S. PATENT DOCUMENTS

| 4,995,004 | A | * | 2/1991 | Lee | ........................ 365/189.11 |
| 5,777,608 | A | * | 7/1998 | Lipovski et al. | ............. 345/519 |
| 6,882,583 | B2 | * | 4/2005 | Gorman et al. | ............. 365/200 |
| 7,285,982 | B2 | * | 10/2007 | Madurawe | .................... 326/38 |

* cited by examiner

*Primary Examiner*—Son Dinh
(74) *Attorney, Agent, or Firm*—Sterne Kessler Goldstein & Fox, p.l.l.c.

(57) ABSTRACT

A quad SRAM based one time programmable memory cell is provided. Prior to programming, the memory cell operates as an SRAM memory cell. After programming, the memory cell operates as a one-time programmable non-volatile memory cell. The memory cell includes a storage element coupled at a first side to a first upper fuse and a first lower fuse and coupled at a second side to a second upper fuse and a second lower fuse. When the first upper fuse and second lower fuse are programmed, the storage element outputs a first value. When the second upper fuse and first lower fuse are programmed, the storage element outputs a second value. After programming the upper fuse acts as a pull-up fuse and the lower fuse acts as a pull-down fuse hold the state of the cell.

19 Claims, 4 Drawing Sheets

QUAD SRAM BASED ONE TIME PROGRAMMABLE MEMORY

FIELD OF THE INVENTION

The present invention relates generally to one time programmable memory cells.

BACKGROUND OF THE INVENTION

Two types of memory devices are commonly used in the field of data storage. The first type is volatile memory in which stored information is lost when power is removed. The second type is non-volatile memory in which the information is preserved after the power is removed. Non-volatile memory may be designed for multiple programming or for one-time programming. Examples of multiple programmable non-volatile memory include electrically erasable programmable read only memories (EEPROMs) and flash memory. Unlike a multiple programmable memory, a one-time programmable non-volatile memory can be programmed only once. The programming typically involves the "blowing" of a fuse element of the cell. The programming of a one-time programmable memory is irreversible.

Fuse elements in typical one-time programmable memory cells are thin oxide devices. Thin oxide devices are susceptible to voltage stress, particularly as the voltage demands on these thin oxide devices also increases. Additionally, many modern applications require secure storage of large amounts of data in non-volatile memories. Because of the nature of the information required in these secure applications, the ability to output a random value on power-up and to protect stored data from alternation after programming are critical.

What is therefore needed is a one time programmable memory cell with increased manufacturability margin which also reduces the voltage stress on the thin oxide fuses.

What is further needed is a one time programmable memory cell providing random output during power up.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

Figure 1:
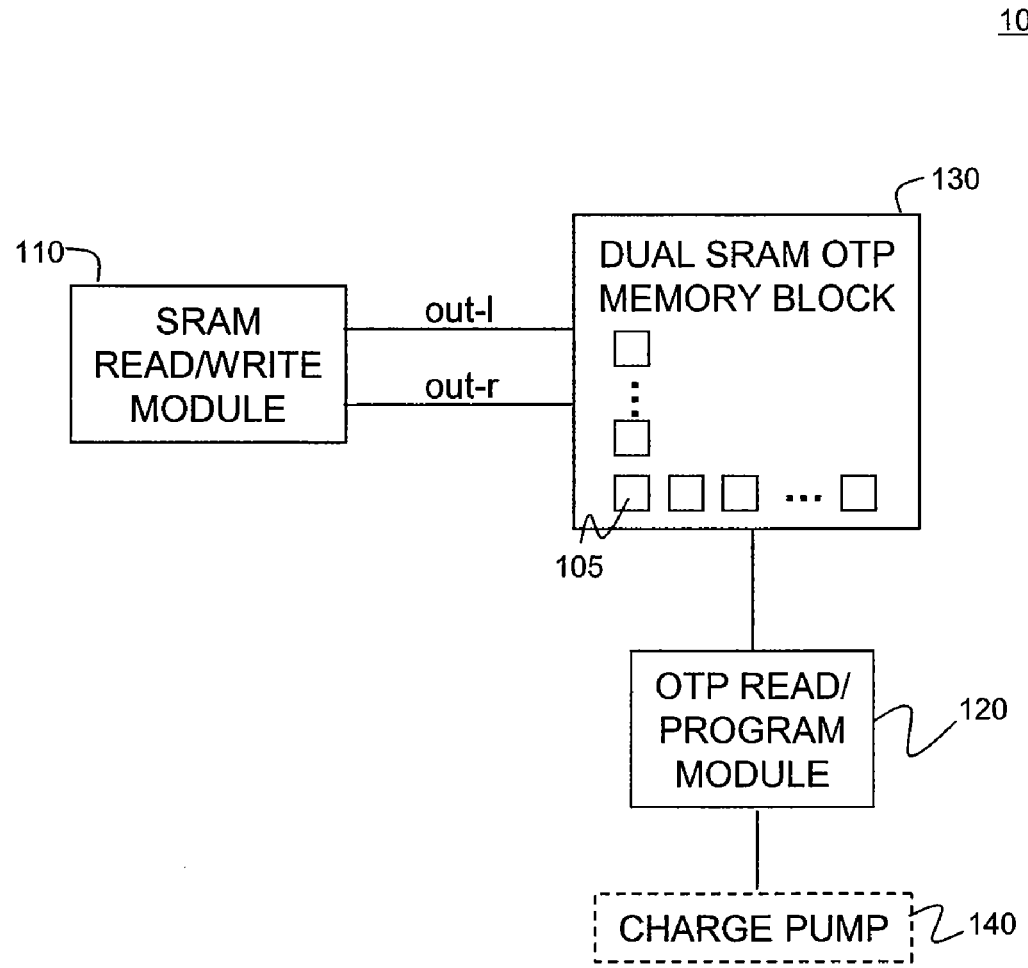
FIG. 1 depicts an exemplary one time programmable (OTP) memory device, according to embodiments of the present invention.

The present invention will now be described with reference to the accompanying drawings. In the drawings, like reference numbers can indicate identical or functionally similar elements. Additionally, the left-most digit(s) of a reference number may identify the drawing in which the reference number first appears.

DETAILED DESCRIPTION OF THE INVENTION

1. One Time Programmable Memory Device

FIG. 1 depicts an exemplary one time programmable (OTP) memory device 100, according to embodiments of the present invention. Memory device 100 includes a dual SRAM OTP memory block 130, an SRAM read/write module 110, and an OTP read/program module 120.

Dual SRAM OTP memory block 130 includes one or more dual RAM OTP memory cells 105. A dual SRAM OTP memory cell 105 is described in further detail in Section 2 below. When multiple dual SRAM OTP memory cells 105 are present in memory array 130, the memory cells 105 may be arranged in a plurality of rows and columns forming an array. A column of memory cells shares a single bit line. A row of memory cells may also share a common row select line. Dual SRAM OTP block 130 includes input/output out-l and out-r. Although FIG. 1 depicts dual SRAM OTP memory block 130 as having a single set of input/outputs, as would be appreciated by persons of skill in the art, each memory cell 105 in memory block 130 may have input/output out-l and out-r SRAM read/write module 110 is configured to read data from or write data to one or more SRAM-OTP memory cells 105 prior to OTP programming (referred to herein as "pre-programming"). SRAM read/write module 110 is also used to read a programmed SRAM-OTP memory cell. In this embodiment, SRAM read/write module 110 may include an NMOS pass transistor coupled to the out-l and an NMOS pass transistor coupled to out-r. The gates of the pass transistors are coupled to the word line for the memory cell and the drains are coupled to the bit line for the memory cell. In this embodiment, the storage structure of the memory cell may be considered equivalent to a standard 6T SRAM memory cell.

OTP read/program module 120 is configured to program one or more SRAM-OTP memory cells 105. OTP read/program module 120 may also be configured to read one or more SRAM-OTP memory cells 105. OTP read/program module 120 provides the inputs required to read or program a memory cell 105. These inputs are described in further detail in Sections 2 and 3 below. OTP read/program module 120 may include an address decoder and control block configured for controlling internal signals of memory block 100. For example, an address decoder and control sub-block may receive an address or range of addresses identifying the memory cell or cells to be programmed, read, or verified. OTP read/program module 120 may also include a row decoder configured to select one row at a time from memory block 130 and/or a program column select configured to select one or more bit lines during programming operation.

Memory device 100 may also include a charge pump 140 coupled to OTP read/program module 120. When present, charge pump 110 generates a high voltage supply (approximately 5V) from a lower core voltage supply (e.g., 1.0V or 2.0V) for programming a memory cell 105. When not present, the high voltage necessary for programming on or more fuses in a memory cell is provided by an external supply.

2. Quad SRAM-Based One Time Programmable Memory Cell

Figure 2:
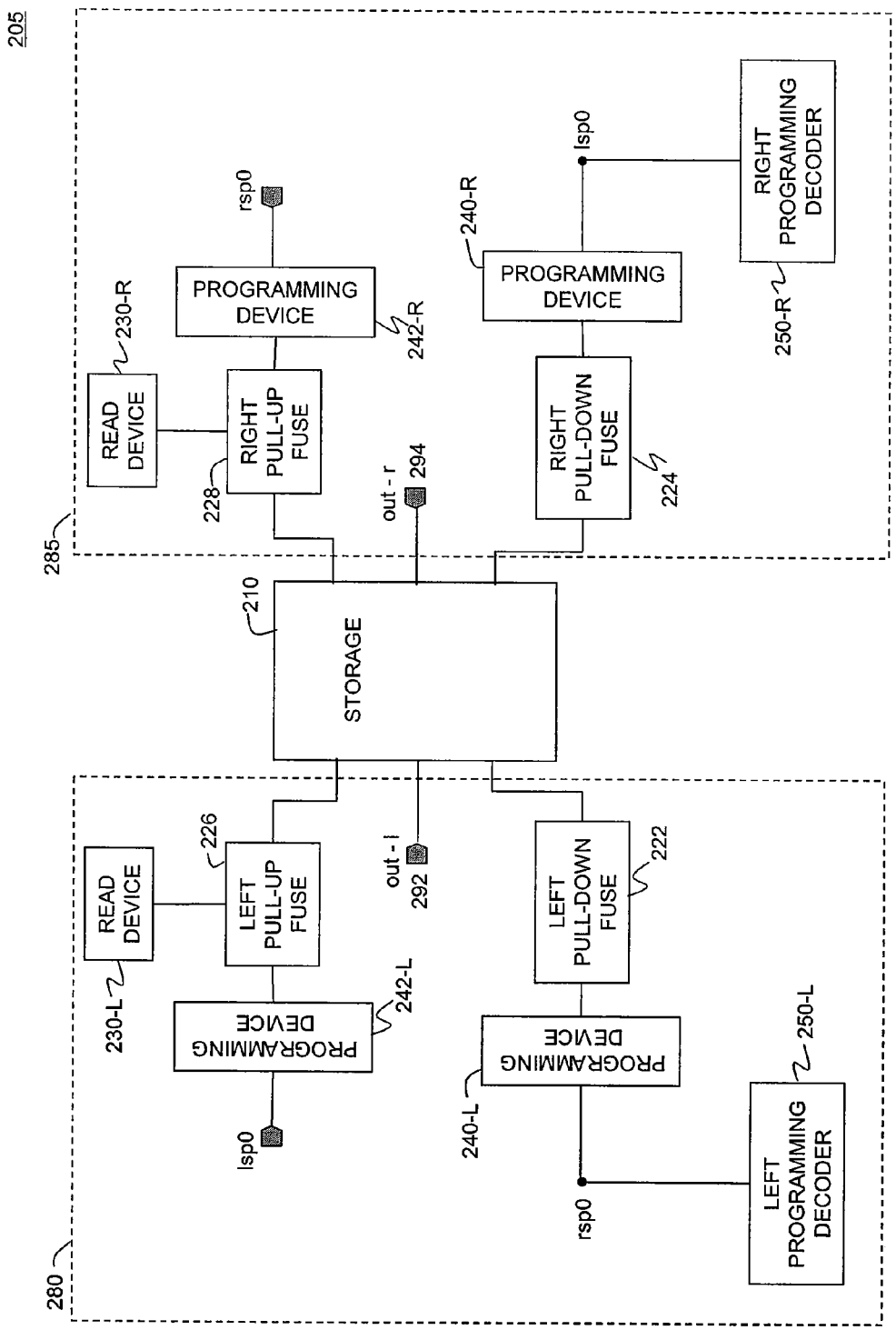
FIG. 2 depicts a high level block diagram of an exemplary SRAM-based OTP memory cell, according to embodiments of the present invention.

FIG. 2 depicts a high level block diagram of an exemplary SRAM-based OTP memory cell 205, according to embodiments of the present invention. OTP memory cell 205 includes a storage element 210, a left side structure 280, and a symmetric right side structure 285.

Left side structure 280 includes a left pull-up fuse 226 and a left pull-down fuse 222. Left pull-up fuse 226 is coupled to storage element 210, upper left programming device 242-L, and read device 230-L. Left pull-down fuse 222 is coupled to storage element 210 and lower left programming device 240-L. Right side structure 285 includes a right pull-up fuse 228 and a right pull-down fuse 224. Right pull-up fuse 228 is coupled to storage element 210, upper right programming device 242-R, and read device 230-R. Right pull-down fuse 224 is coupled to storage element 210 and lower right programming device 240-R.

The state assigned to a memory cell may be determined by a specific application or implementation. For example, in an application, left pull-down fuse 222 and right pull-up fuse 228 are programmed to represent a logic "0" state, and right pull-down fuse 224 and left pull-up fuse 226 are programmed to represent a logic "1" state. When a logic "0" state is programmed, lower left fuse 222 operates as pull-down device on out$_l$ node 292 and upper right fuse 228 operates as a pull-up device on out$_r$ node 294. Conversely, when a logic "1" state is programmed, lower right fuse 224 operates as a pull-down device on out$_r$ node 294 and upper left fuse 226 operates as a pull-up device on out$_l$ node 292.

Read devices 230-L,R provide a reference current for reading the state of memory cell 205. Each of programming devices 240-L,R and 242-L,R provides a programming current and voltage for its associated fuse. Programming decoder 250-L enables programming of the left pull-down fuse 222 and the right pull-up fuse 228. Programming decoder 250-R enables programming of the right pull-down fuse 224 and the left pull-up fuse 226.

Memory cell 205 is configured to be an SRAM device that is electrically writeable and changeable until one or more fuses are programmed. The use of a pull-up fuse and a pull-down fuse to represent a state of a programmed memory cell provides significantly more manufacturability margin than prior OTP memory cells. Additionally, the use of a pull-up fuse and pull-down fuse makes altering the stored data more difficult and thus, provides additional security protection for the memory contents. The structure of exemplary memory cell 205 also allows the storage element to be on a lower voltage domain which reduces leakage current and reduces stress on the unprogrammed fuses.

Figure 3:
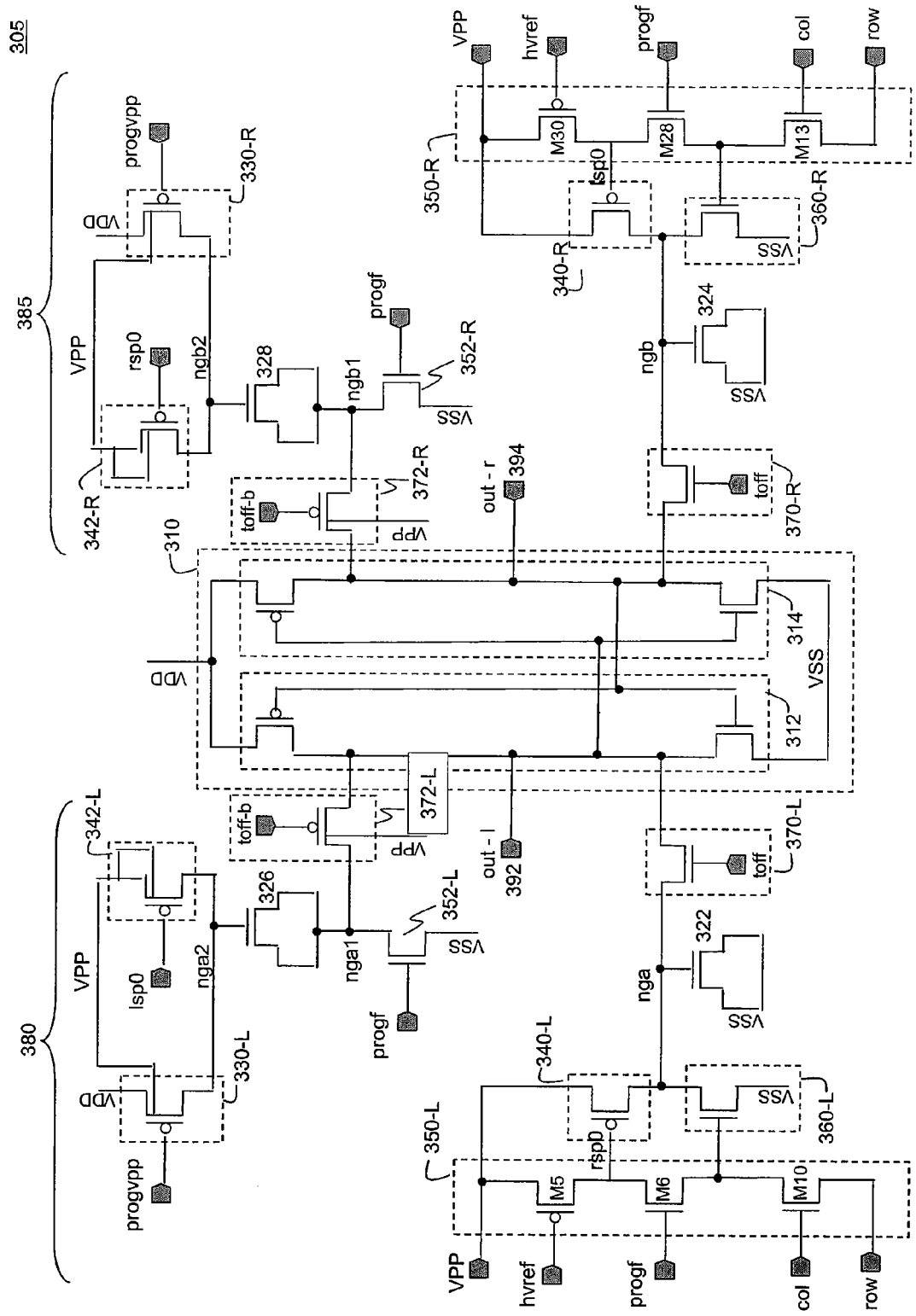
FIG. 3 depicts an exemplary SRAM-based OTP memory cell, according to embodiments of the present invention.

FIG. 3 depicts an exemplary SRAM-based OTP memory cell 305, according to embodiments of the present invention. OTP memory cell 305 includes a storage element 310, a left side structure 380, and a symmetric right side structure 385.

Storage element 310 includes a set of fed back inverters 312, 314. Inverters 312 and 314 help to reinforce the state programmed in the memory cell. Storage element 310 also includes a first input/output, out-l 392, and a second input/output, out-r 394. Prior to programming OTP memory cell 305, the out-l and out-r nodes can be read or written to like an SRAM via any typical SRAM construct. For example, out-l 392 and out-r 394 may be coupled to an SRAM read/write module and/or an OTP read module.

Memory cell 305 includes a lower left fuse 322, a lower right fuse 324, an upper left fuse 326, and an upper right fuse 328. A fuse may be a thin oxide MOS transistor including, but limited to, an NMOS transistor, a PMOS transistor, an NMOS transistor in Nwell, or an NMOS transistor with native $V_t$ implant. In alternative embodiments, a fuse may be a thin oxide capacitors such as a thin oxide NMOS capacitor or a thin oxide PMOS capacitor. An unprogrammed thin gate oxide fuse has a high resistance. A programmed thin gate oxide fuse (commonly referred to as a "blown" fuse) has a low resistance.

Lower left fuse 322 is coupled at its gate to node nga and at its source and drain to ground ($V_{SS}$). Lower right fuse 324 is coupled at its gate to node ngb and at its source and drain to ground ($V_{SS}$). Upper left fuse 326 is coupled at its gate to node nga2 and at its source and drain to node nga1. Upper right fuse 328 is coupled at its gate to node ngb2 and at its source and drain to node ngb1.

Buffers 370-L and 370-R protect storage element 310 when lower left fuse 322 and/or lower right fuse 324 are being programmed. Buffers 370-L, 370-R are optional. In an embodiment, buffer 370-L includes an NMOS transistor coupled at its gate to a toff signal, at its drain to storage element 310, and at its source to node nga. Buffer 370-R includes an NMOS transistor coupled at its gate to the toff signal, at its drain to storage element 310, and at its source to node ngb. When one or more fuses are being programmed, toff is set to ground, isolating the storage element 310 from lower left fuse 322 and lower right fuse 324. When OTP memory is being read, toff is set to high to couple the lower left fuse 322 and lower right fuse 324 to storage element 310.

Similarly, buffers 372-L and 372-R protect storage element 310 when upper left fuse 326 and/or upper right fuse 328 are being programmed. Buffers 372-L, 372-R are optional. In an embodiment, buffer 372-L includes a PMOS transistor coupled at its gate to a toff-b signal, at its drain to storage element 310, and at its source to node nga1. The toff-b signal is the inversion of the toff signal. Buffer 372-R includes a PMOS transistor coupled at its gate to the toff-b signal, at its drain to storage element 310, and at its source to node ngb1. When one or more fuses are being programmed, toff-b is set to high, isolating the storage element 310 from upper left fuse 326 and upper right fuse 328. When OTP memory is being read, toff-b is set to ground to couple the upper left fuse 326 and upper right fuse 328 to storage element 310.

Programming decoder 350-L enables the programming of lower left fuse 322 and upper right fuse 328. Programming decoder 350-R enables the programming of lower right fuse 324 and upper left fuse 326. Programming decoder 350-L is coupled to lower left fuse 322 and to upper right fuse 328 via node rsp0. Programming decoder 350-R is coupled lower right fuse 324 and to upper left fuse 326 via node lsp0.

Programming decoder 350-L includes transistors M5, M6, and M10. In an embodiment, transistor M5 is a PMOS transistor and transistors M6 and M10 are NMOS transistors. In this embodiment, the gate of transistor M5 is coupled to a reference voltage input for the decoder (hvref), the source of transistor M5 is coupled to the programming voltage ($V_{PP}$), and the drain of transistor M5 is coupled to node rsp0. Node rsp0 is in turn coupled to lower left programming device 340-L and to upper right programming device 344. The gate of transistor M6 is tied to a fuse programming input (progf), the drain of transistor M6 is coupled to the drain of transistor M5, and the source of transistor M6 is coupled to fuse buffer 360-L and to the drain of select transistor M10. The gate of select transistor M10 is tied to a column select line (col-l), the source of transistor M10 is tied to a row select line (row-l), and the drain of select transistor M10 is coupled to fuse buffer 360-L. When OTP memory cell 305 is selected for programming the inputs of the programming decoder 350-L (col-l, row-l, hvref, and progf) are set such that the voltage level at node rsp0 is ground ($V_{SS}$).

Programming decoder 350-R includes transistors M30, M28, and M13. In an embodiment, transistor M30 is a PMOS transistor and transistors M28 and M13 are NMOS transistors. In this embodiment, the gate of transistor M30 is coupled to a reference voltage input for the decoder (hvref), the source of transistor M30 is coupled to the programming voltage ($V_{PP}$), and the drain of transistor M30 is coupled to node lsp0. Node lsp0 is in turn coupled to lower right programming device 340-R and to upper left programming device 342. The gate of transistor M28 is tied to a fuse programming input (progf), the drain of transistor M28 is coupled to the drain of transistor M30, and the source of transistor M28 is coupled to fuse buffer 360-R and to the drain of select transistor M13. The gate of select transistor M13 is tied to a column select line (col-r), the source of transistor M13 is tied to a row select line (row-r), and the drain of select transistor M13 is coupled to fuse buffer 360-R. When OTP memory cell 305 is selected for programming the inputs of the programming decoder 350-R (col-r, row-r, hvref, and progf) are set such that the voltage level at node lsp0 is ground ($V_{SS}$).

Select devices 352-L and 352-R enable the selection of upper left fuse 326 and upper right fuse 328, respectively, for programming. In an embodiment, select device 352-L is an NMOS transistor coupled at its gate to programming select signal (progf), at its drain to upper left fuse 326, and at its source to ground and select device 352-R is an NMOS transistor coupled at its gate to programming select signal (progf), at its drain to upper right fuse 328, and at its source to ground.

Each of programming devices 340-L, 340-R, 342-L, and 342-R provide programming current and voltage to its respective fuse 322, 324, 326, and 328 during programming operation. The programming devices also couple or decouple their respective fuse from the programming supply voltage ($V_{PP}$). When a programming decoder 350 presents a voltage level of ground ($V_{SS}$) at the gate of a programming transistor 340, the transistor conducts, coupling the programming current and voltage to the gate of its associated fuse.

Programming device 340-L includes a transistor coupled at its gate to node rsp0 of programming decoder 350-L, at its drain to lower left fuse 322 (node nga), and at its source to programming voltage $V_{PP}$. Programming device 340-R includes a transistor coupled at its gate to node lsp0 of programming decoder 350-R, at its drain to lower right fuse 324 (node ngb), and at its source to programming voltage $V_{PP}$. Programming device 342-L includes a transistor coupled at its gate to node lsp0 of programming decoder 350-R, at its drain to upper left fuse 326 (node nga2), and at its source to programming voltage $V_{PP}$. Programming device 342-R includes a transistor coupled at its gate to node rsp0 of programming decoder 350-L, at its drain to upper right fuse 328 (node ngb2), and at its source to programming voltage $V_{PP}$. In an embodiment, the programming transistors are PMOS transistors.

Fuse buffer 360-L, 360-R protects the fuses when the fuses are not being programmed or read. Fuse buffer 360-L, 360-R are optional. Each fuse buffer 360-L, 360-R includes a transistor coupled at its gate to programming decoder 350, at its source to ground ($V_{SS}$), and at its drain to node nga, ngb. In an embodiment, fuse buffer 360 is a NMOS transistor. When activated, a fuse buffer 360 sinks current, causing its associated node (nga or ngb) to go to ground. This prevents stress on the fuses when the OTP memory cell is not selected for programming or reading.

Each read device 330-L, 330-R provides read reference current for its respective side. Read device 330-L is a transistor coupled at its gate to a reference signal (progvpp), at its source to supply voltage VDD, and at its drain to node nga2 and upper right fuse 326. Read device 330-R is a transistor coupled at its gate to a reference signal (progvpp), at its source to supply voltage VDD, and at its drain to node ngb2 and upper left fuse 328. In an embodiment, read devices 330-L, 330-R are PMOS transistors.

3. System Operation 3.1 Pre-Programming Mode

Prior to programming the state of the SRAM-OTP memory cell, out-l and out-r are accessed via standard SRAM read and write circuits. To set of the state of the SRAM structure, out-l and out-r are driven high or low.

3.2 Program Mode

Figure 4:
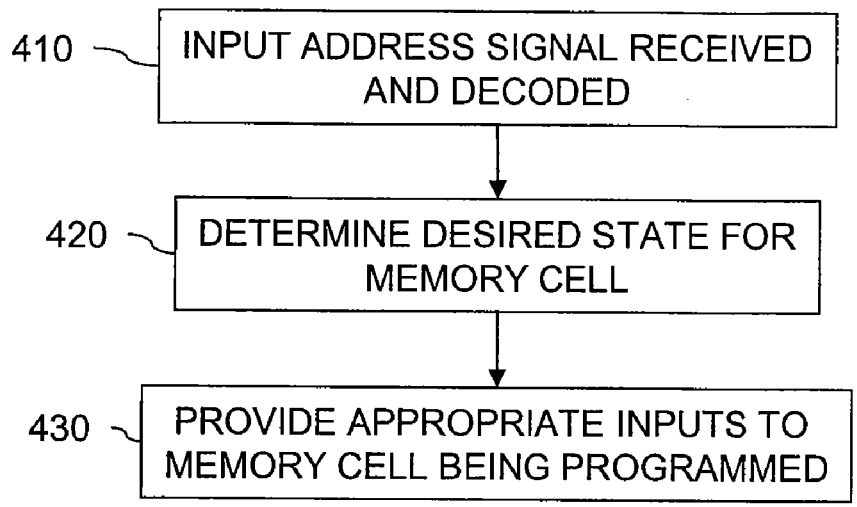
FIG. 4 depicts a flowchart of an exemplary method for programming an SRAM-OTP memory cell, according to embodiments of the present invention.

Program mode is used to program one or more memory cells in a memory array such as memory array 130 depicted in FIG. 1. FIG. 4 depicts a flowchart 400 of an exemplary method for programming an SRAM-OTP memory cell, according to embodiments of the present invention. Flowchart 400 is described with continued reference to the exemplary embodiments illustrated in FIGS. 1-3. However, flowchart 400 is not limited to those embodiments. Note that the steps of flowchart 400 do not necessarily have to occur in the order shown.

In step 410, a memory cell 105 is selected for programming by OTP read/program module 120. For example, OTP read/program module 120 may receive an input address associated with the memory cell 105 to be programmed.

In step 420, the desired state for the memory cell is determined. For example, if a state of logic "0" is to be set, lower left fuse 322 and upper right fuse 328 must be programmed. Alternatively, if a state of logic "1" is to be set, lower right fuse 324 and upper left fuse 326 must be programmed.

In step 430, the appropriate programming inputs are provided to the memory cell being programmed. The memory cell being programmed receives a number of inputs required to cause the memory cell to be properly programmed.

As described in reference to FIG. 3 above, inputs hvref, progf, col-l, and row-l are used to select or deselect decoder 350-L. For example, when decoder 350-L is selected, inputs hvref, progf, col-l, and row-l are configured to cause programming device 340-L to apply the programming voltage ($V_{PP}$) and programming current to lower left fuse 322 and to cause programming device 342-R to apply programming voltage ($V_{PP}$) and programming current to upper right fuse 328. In this example, input progf is set to high, coupling the source and drain of upper right fuse 328 to ground. Because the source and drain of lower left fuse 322 and the source and drain of upper right fuse 328 are tied to ground, the fuses 322 and 328 see a high voltage between their gate and source. The voltage is sufficient to break down the thin gate oxide of the fuse (e.g., a voltage in the 3-5V range). When the oxide is broken down, a conductive path is formed between the gate and the source/drain regions of the transistor, programming the fuse.

Inputs toff and toff-b are used to isolate storage element 310 from the fuses during programming operation. In an embodiment, toff is set to ground ($V_{SS}$) and toff-b is set to high during programming operation.

Inputs hvref, progf, col-r, and row-r are used to select or deselect decoder 350-R. For example, when decoder 350-R is selected, inputs hvref, progf, col-r, and row-r are configured to cause programming device 340-R to apply the programming voltage ($V_{PP}$) and programming current to lower right fuse 324 and to cause programming device 342-R to apply programming voltage ($V_{PP}$) and programming current to upper left fuse 326. In this example, input progf is set to high, coupling the source and drain of upper left fuse to ground. Because the source and drain of lower right fuse 324 and the source and drain of upper left fuse 326 are tied to ground, the fuses 324 and 326 see a high voltage between their gate and source. The voltage is sufficient to break down the thin gate oxide of the fuse (e.g., a voltage in the 3-5V range). When the oxide is broken down, a conductive path is formed between the gate and the source/drain regions of the transistor, programming the fuse.

3.2 Read Mode

Read mode is used to read the state of an SRAM-OTP memory cell in a memory array. This operation is typically, but not necessarily exclusively, performed after the OTP element memory core 105 has been programmed and verified.

Figure 5:
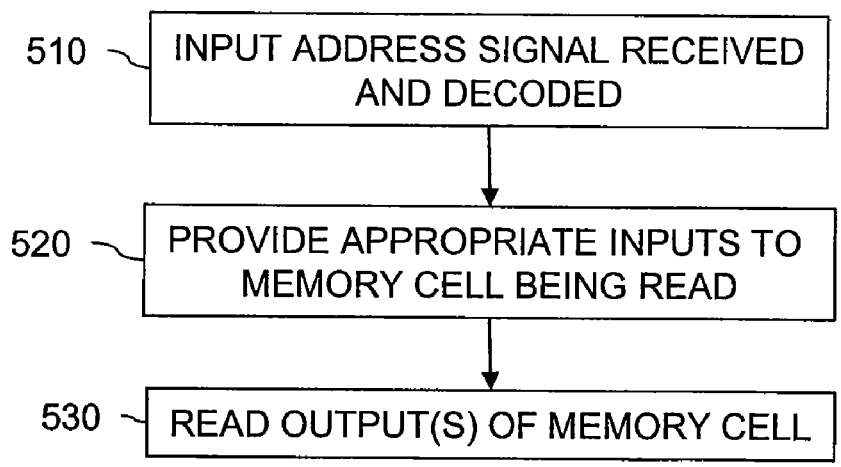
FIG. 5 depicts a flowchart of an exemplary method for reading an SRAM-OTP memory cell, according to embodiments of the present invention.

FIG. 5 depicts a flowchart 500 of an exemplary method for reading an SRAM-OTP memory cell, according to embodiments of the present invention. Flowchart 500 is described with continued reference to the exemplary embodiments illustrated in FIGS. 1-3. However, flowchart 500 is not limited to those embodiments. Note that the steps of flowchart 500 do not necessarily have to occur in the order shown.

In step 510, a memory cell 105 is selected for reading. In an embodiment, OTP read/program module 120 reads the state of the programmed memory cell 105. In addition, or alternatively, SRAM read/write module 110 reads the state of the programmed memory cell.

In step 520, the appropriate read inputs are provided to the memory cell being read. The memory cell being read receives a number of inputs required to cause the memory cell to be properly read.

Inputs toff and toff-b are used to couple fuses 322, 324, 326, and 328 to storage element 310. In an embodiment, toff is set to HIGH and toff-b is set to ground to couple the fuses to the storage element. The prog-vpp input is driven to ground to couple $V_{PP}$ to node nga and to couple $V_{PP}$ to node ngb. Inputs hvref, progf, col-l, and row-l are set to drive node rsp0 to $V_{PP}$. Inputs hvref, progf, col-r, and col-r are set to drive node lsp0 to $V_{PP}$.

For example, if fuses 322 and 328 are programmed, fuse 322 has a resistive path to ground and fuse 328 has a resistive path to node ngb2 during programming operation. Node ngb2 is driven to $V_{PP}$ providing the pull-up current on out-r node 394. Fuse 322 provides the pull-down current for the out-l node 392. The state of memory cell is then set. Inverters 312, 314 reinforce the state of the memory cell. For example, an electrical disturbance to cell 205 would only remain for a short period of time because the fuses would overdrive the cell back to the programmed state.

In step 530, the outputs of the SRAM-OTP memory structure 310 are read. As described above, SRAM-OTP memory structure 310 has a first output (out-l) and a second output (out-r). The values of out-l and out-r determine the state of the memory cell.

4. Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A one-time programmable memory cell, comprising:
   a storage element having a first upper input, a second upper input opposite the first upper input, a first lower input, a second lower input opposite the first lower input, a first output, and a second output opposite the first output;
   a first fuse coupled to the first upper input, wherein the first fuse, when programmed, acts as a pull-up device on the first output;
   a second fuse coupled to the second upper input, wherein the second fuse, when programmed, acts as a pull-up device on the second output;
   a third fuse coupled to the first lower input, wherein the third fuse, when programmed, acts a pull-down device on the first output; and
   a fourth fuse coupled to the second lower input, wherein the fourth fuse, when programmed, acts a pull-down device on the second output.

2. The one-time programmable memory cell of claim 1, wherein when the first fuse and fourth fuse are programmed, the storage element outputs a first value during a read operation, and when the second fuse and third fuse are programmed, the storage element outputs a second value during a read operation.

3. The one-time programmable memory cell of claim 1 wherein the storage element operates as an SRAM cell when the first fuse, the second fuse, the third fuse, and the fourth fuse are not programmed.

4. The one-time programmable memory cell of claim 1, wherein the first fuse, the second fuse, the third fuse, and the fourth fuse are thin-oxide MOS transistors.

5. The one-time programmable memory cell of claim 4, wherein at least one of the thin-oxide MOS transistors is an NMOS transistor.

6. The one-time programmable memory cell of claim 4, wherein at least one of the thin-oxide MOS transistors is an NMOS transistor with a native $V_T$ implant.

7. The one-time programmable memory cell of claim 4, wherein at least one of the thin-oxide MOS transistor is an NMOS transistor in $N_{WELL}$.

8. The one-time programmable memory cell of claim 4, wherein at least one of the thin-oxide MOS transistors is a PMOS transistor.

9. The one-time programmable memory cell of claim 1, further comprising:
   a first programming decoder coupled to the third fuse and the second fuse; and
   a second programming decoder coupled to the fourth fuse and the first fuse.

10. The one-time programmable memory cell of claim 1, wherein the storage element comprises:
    a first inverter coupled to the first fuse and the third fuse; and
    a second inverter coupled to the second fuse and the fourth fuse.

11. The one-time programmable memory cell of claim 1 further comprising:
    a first buffer device coupled between the first fuse and the storage element;
    a second buffer device coupled between the third fuse and the storage element;
    a third buffer device coupled between the second fuse and the storage element; and
    a fourth buffer device coupled between the fourth fuse and the storage element.

12. A non-volatile dual SRAM one-time programmable memory device, comprising:
    a dual SRAM one-time programmable memory block including one or more dual SRAM one-time programmable memory cells, wherein a dual SRAM one-time programmable memory cell operates as an SRAM memory cell prior to programming and operates as a one-time programmable memory cell after programming;

an SRAM module coupled to the dual SRAM one-time programmable memory block, wherein the SRAM read/write module is configured to read from and write to one or more dual SRAM one-time programmable memory cells prior to programming; and an one-time programmable module configured to program one or more one-time programmable memory cells and to read one or more one-time programmable memory cells after programming.

13. The memory device of claim 12, wherein a one-time programmable memory cell comprises:

a storage element having a first upper input, a second upper input opposite the first upper input, a first lower input, a second lower input opposite the first lower input, a first output, and a second output opposite the first output;

a first fuse coupled to the first upper input, wherein the first fuse, when programmed, acts as a pull-up device on the first output;

a second fuse coupled to the second upper input, wherein the second fuse, when programmed, acts as a pull-up device on the second output;

a third fuse coupled to the first lower input, wherein the third fuse, when programmed, acts a pull-down device on the first output; and a fourth fuse coupled to the second lower input, wherein the fourth fuse, when programmed, acts a pull-down device on the second output.

14. The memory device of claim 13, wherein when the first fuse and fourth fuse are programmed, the storage element outputs a first value during a read operation, and when the second fuse and third fuse are programmed, the storage element outputs a second value during a read operation.

15. The memory device of claim 13, wherein the first fuse, the second fuse, the third fuse, and the fourth fuse are thin-oxide MOS transistors.

16. The memory device of claim 15, wherein at least one of the thin-oxide MOS transistors is an NMOS transistor.

17. The memory device of claim 15, wherein at least one of the thin-oxide MOS transistors is an NMOS transistor with a native $V_T$ implant.

18. The memory device of claim 15, wherein at least one of the thin-oxide MOS transistors is an NMOS transistor in $N_{WELL}$.

19. The memory device of claim 15, wherein at least one of the thin-oxide MOS transistors is a PMOS transistor.

* * * * *